(12) United States Patent
Dudovitch

(10) Patent No.: US 12,400,887 B2
(45) Date of Patent: Aug. 26, 2025

(54) METHOD AND SYSTEM OF OPERATING SUBSTRATE PROCESSING BY CALCULATING WAFER THICKNESS OUT OF WAFER MAPPING PROCESS

(71) Applicant: APPLIED MATERIALS ISRAEL LTD., Rehovot (IL)

(72) Inventor: Ofer Dudovitch, Center District (IL)

(73) Assignee: Applied Materials Israel Ltd., Rehovot (IL)

( * ) Notice: Subject to any disclaimer, the term of this patent is extended or adjusted under 35 U.S.C. 154(b) by 346 days.

(21) Appl. No.: 18/071,400

(22) Filed: Nov. 29, 2022

(65) Prior Publication Data

US 2024/0178022 A1    May 30, 2024

(51) Int. Cl.
*H01L 21/67* (2006.01)
*B65G 47/90* (2006.01)
(Continued)

(52) U.S. Cl.
CPC ........ *H01L 21/67253* (2013.01); *B65G 47/90* (2013.01); *H01J 37/20* (2013.01); *H01J 37/244* (2013.01); *H01J 37/28* (2013.01); *H01L 21/67766* (2013.01); *H01L 21/68707* (2013.01); *H01J 2237/201* (2013.01);
(Continued)

(58) Field of Classification Search
CPC ................................................. H01L 21/67253
See application file for complete search history.

(56) References Cited

U.S. PATENT DOCUMENTS 5,239,182 A * 8/1993 Tateyama .......... H01L 21/67796
414/331.14
6,013,920 A * 1/2000 Gordon ............. H01L 21/67265
250/559.36
(Continued)

FOREIGN PATENT DOCUMENTS

JP         2868645 B2 *  3/1999
JP         4015762 B2    9/2007
KR      19980022647 U *  7/1998

OTHER PUBLICATIONS

PCT/US2023/081676, "International Search Report and the Written Opinion", Apr. 2, 2024, 9 pages.
(Continued)

*Primary Examiner* — Gerald McClain
(74) *Attorney, Agent, or Firm* — Kilpatrick Townsend & Stockton LLP

(57) ABSTRACT

A method of operating a substrate processing system that includes a substrate processing chamber, a substrate storage container and robot configured to select a substrate from the substrate storage container and transfer a selected substrate into the substrate processing chamber, the method comprising detecting a lower edge and upper edge of the substrate, calculating a thickness of the substrate based on the detected lower and upper edges of the substrate, comparing the calculated thickness of the substrate to an expected thickness of the substrate, and (i) if the calculated thickness matches the expected thickness, controlling the robot to transfer the substrate into the substrate processing chamber, (ii) if the calculated thickness does not match the expected thickness, generating an alert indicating a thickness mismatch.

20 Claims, 9 Drawing Sheets

(51) Int. Cl.
    *H01J 37/20*       (2006.01)
    *H01J 37/244*     (2006.01)
    *H01J 37/28*       (2006.01)
    *H01L 21/677*     (2006.01)
    *H01L 21/687*     (2006.01)

(52) U.S. Cl.
    CPC .............. *H01J 2237/20278* (2013.01); *H01J 2237/24578* (2013.01); *H01J 2237/31749* (2013.01)

(56) References Cited

U.S. PATENT DOCUMENTS

| | | | | |
|---|---|---|---|---|
| 6,144,926 | A * | 11/2000 | Ishizawa | H01L 21/681 700/121 |
| 6,203,617 | B1 * | 3/2001 | Tanoue | H01L 21/67271 414/416.03 |
| 6,286,685 | B1 * | 9/2001 | Kononchuk | G01G 9/00 257/E21.295 |
| 6,353,473 | B1 | 3/2002 | Ishimori et al. | |
| 6,437,868 | B1 | 8/2002 | Coult et al. | |
| 6,473,987 | B1 | 11/2002 | Steere et al. | |
| 7,596,456 | B2 * | 9/2009 | Mollenkopf | H01L 21/67265 702/33 |
| 11,469,123 | B2 * | 10/2022 | Bergantz | H01L 21/67356 |
| 2007/0118300 | A1 * | 5/2007 | Mollenkopf | H01L 21/67265 702/33 |
| 2021/0057246 | A1 * | 2/2021 | Bergantz | H01L 21/67356 |

OTHER PUBLICATIONS

PCT/US2023/081676, "International Preliminary Report on Patentability", Jun. 12, 2025, 6 pages.

* cited by examiner

METHOD AND SYSTEM OF OPERATING SUBSTRATE PROCESSING BY CALCULATING WAFER THICKNESS OUT OF WAFER MAPPING PROCESS

BACKGROUND OF THE INVENTION

The manufacture of semiconductor devices typically includes many different processing steps that are performed in semiconductor fabrication facility by multiple different types of tools. For example, in order to complete the fabrication of integrated circuits on a semiconductor wafer, the wafer might be transferred to and processed by a suite of tools that includes a chemical vapor deposition tool, a physical vapor deposition tool, an etch tool, a chemical mechanical polishing tool, a photolithography tool, and a metrology tool, among many others.

Historically, semiconductor manufacturers typically processed wafers of a particular diameter (e.g., 200 mm or 300 mm wafers) within a suite of tools that were specifically designed to operate on wafers of that diameter and all wafers of that diameter were of the same thickness. For example, all 200 mm wafers processed by a suite of tools might be 700 microns thick while all 300 mm wafers processed by a different set of tools might be 775 microns thick. Thus, any given tool was typically used to only process wafers of a specific, known thickness.

In recent years, however, various semiconductor manufacturers have started processing substrates, such as silicon wafers, for the formation of many different types of integrated circuits and devices some of which are fabricated on semiconductor wafers that have different thicknesses. For example, a semiconductor manufacturer might produce some products on a first set of 200 mm silicon wafers that are 700 microns thick while other products are produced on a second set of 200 mm silicon wafers that are 300 microns thick and still other products are produced on a third set of 200 mm silicon wafers that are 1,400 microns thick.

A given processing tool can be set up within a fabrication facility to accept and process each of the first set of wafers (wafers of 700 microns thick), the second set of wafers (wafers that are 300 microns thick), and the third set of wafers (wafers that are 1,400 microns thick), but adjustments might need to be enable the tool to correctly process wafers of each of the different thicknesses. If the necessary adjustments are not properly made, the wafers could be damaged when transferred into or processed within the tool or steps associated with processing the wafers within the tool might not be carried out correctly.

In order to prevent the wrong thickness wafers being introduced into a given tool, some semiconductor manufactures require an operator to manually control settings of the tool to configure the tool to the appropriate thickness of wafers to be processed by the tool. Such an approach is prone to human error.

BRIEF SUMMARY OF THE INVENTION

Embodiments of the disclosure provide methods and a system for automatically detecting the thickness of a sample prior to transferring the sample into an evaluation tool. Some embodiments can then, if the sample is either thicker or thinner than what tool is set up to process, can generate an alert or signal indicating a mismatch in the actual thickness of the sample about to be transferred into the tool and the expected thickness. In some embodiments, the tool can respond to the signal by, for example, preventing the transfer of the sample into the tool or performing one or more adjustments within the tool to set the tool to accept and process samples of the actual measured thickness. While embodiments of the disclosure can be used to detect the thickness of a variety of different types of samples, some embodiments are particularly useful in detecting the thickness of samples that are semiconductor wafers or similar specimens.

A method of operating a substrate processing system is provided in some embodiments. The substrate processing system can include a substrate processing chamber, a substrate storage container and robot configured to select a substrate from the substrate storage container and transfer a selected substrate into the substrate processing chamber. The method can include: detecting a lower edge and upper edge of the substrate; calculating a thickness of the substrate based on the detected lower and upper edges of the substrate; comparing the calculated thickness of the substrate to an expected thickness of the substrate; and (i) if the calculated thickness matches the expected thickness, controlling the robot to transfer the substrate into the substrate processing chamber, and (ii) if the calculated thickness does not match the expected thickness, generating an alert indicating a thickness mismatch.

In some embodiments a substrate processing system is provided that includes: a substrate processing chamber; a substrate storage container; a robot configured to select a substrate from the substrate storage container and transfer the selected substrate into the substrate processing chamber; and a processor and a memory coupled to the processor. The memory can include a plurality of computer-readable instructions that, when executed by the processor, cause the system to: detect a lower edge and upper edge of the substrate; calculate a thickness of the substrate based on the detected lower and upper edges of the substrate; compare the calculated thickness of the substrate to an expected thickness of the substrate, and (i) if the calculated thickness matches the expected thickness, controlling the robot to transfer the substrate into the substrate processing chamber, and (ii) if the calculated thickness does not match the expected thickness, generating an alert indicating a thickness mismatch.

In some embodiments a non-transitory, computer-readable memory that stores computer-readable instructions for operating a substrate processing system that includes a substrate processing chamber, a substrate storage container and robot configured to select a substrate from the substrate storage container and transfer the selected substrate into the substrate processing chamber is provided. The system can further include a processor operatively coupled to the substrate processing system. When executed by the processor, the computer-readable instructions can cause the processor to control the substrate processing system to: detect a lower edge and upper edge of the substrate; calculate a thickness of the substrate based on the detected lower and upper edges of the substrate; compare the calculated thickness of the substrate to an expected thickness of the substrate, and (i) if the calculated thickness matches the expected thickness, controlling the robot to transfer the substrate into the substrate processing chamber, and (ii) if the calculated thickness does not match the expected thickness, generating an alert indicating a thickness mismatch.

Various implementations of the method, system or computer-readable instructions can include one or more of the following features. Detecting the lower and upper edges of the substrate can be done during a substrate mapping process in which in which a quantity of substrates in and position of each substrate in the substrate storage container is mapped.

The robot can include a robot arm having a sensor configured to detect the lower and upper edges of the substrate. The robot arm can include first and second fingers spaced apart from each other in an oppositional relationship. The sensor can include a laser and a photodetector. The laser can be positioned near a distal end of the first finger and the photodetector can be positioned near a distal end of the second finger. The laser and photodetector can be aligned with each other such that the photodetector can detect a laser beam emitted from the laser. Detecting the lower and upper edges of the substrate can be done as the robot arm is scanned vertically across the substrate storage container and positioned such that an outer periphery of the substrate passes between the first and second fingers interrupting the laser beam during the scanning process. The system can further include a controller operatively coupled to control functions of the substrate processing system and a computer-readable memory coupled to the controller. The substrate processing chamber can be used for defect review, classification and analysis and the chamber can include a focused ion beam (FIB) column and a scanning electron microscope (SEM) column. The substrate can be a semiconductor wafer.

Additional implementations can further include one or more of the following features. The method can further include entering the expected substrate thickness into the computer-readable memory via a user interface prior to detecting the lower and upper edges of the substrate. The method can further include, prior to detecting the lower and upper edges of the substrate, setting or adjusting one or more components of the substrate processing chamber based on the expected thickness of the substrate. The method can further include, if the calculated thickness does not match the expected thickness, preventing the substrate from being transferred into the substrate processing chamber. The method can further include, if the calculated thickness does not match the expected thickness, setting or adjusting one or more components of the substrate processing chamber based on the calculated substrate thickness.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

DETAILED DESCRIPTION OF THE INVENTION

Figure 1A:
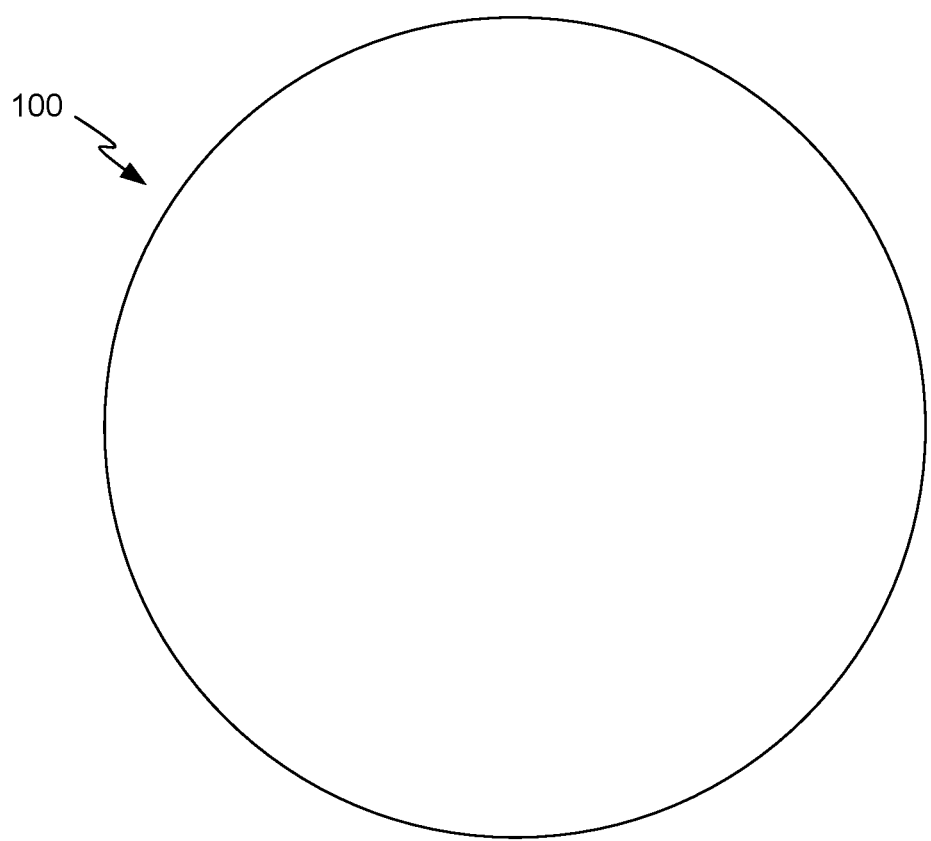
FIG. 1A is a simplified top view of a substrate that can be processed within a tool in accordance with embodiments disclosed herein.

As discussed above, some semiconductor manufacturers process substrates that are of different thicknesses in the same tool or set of tools within a fabrication facility. For example, FIG. 1A is a simplified top view of a substrate 100 that can be processed within a semiconductor or similar fabrication facility. Substrate 100 can be representative of substrate ### discussed below with respect to FIG. # and can be, as non-limiting examples, a silicon substrate, a gallium arsenide (GaAs) substrate, indium phosphide (InP) substrate, or a sapphire substrate among others. Substrate 100 can be generally round and very thin relative to its diameter and is thus sometimes referred to herein as a "wafer".

Figure 1B:
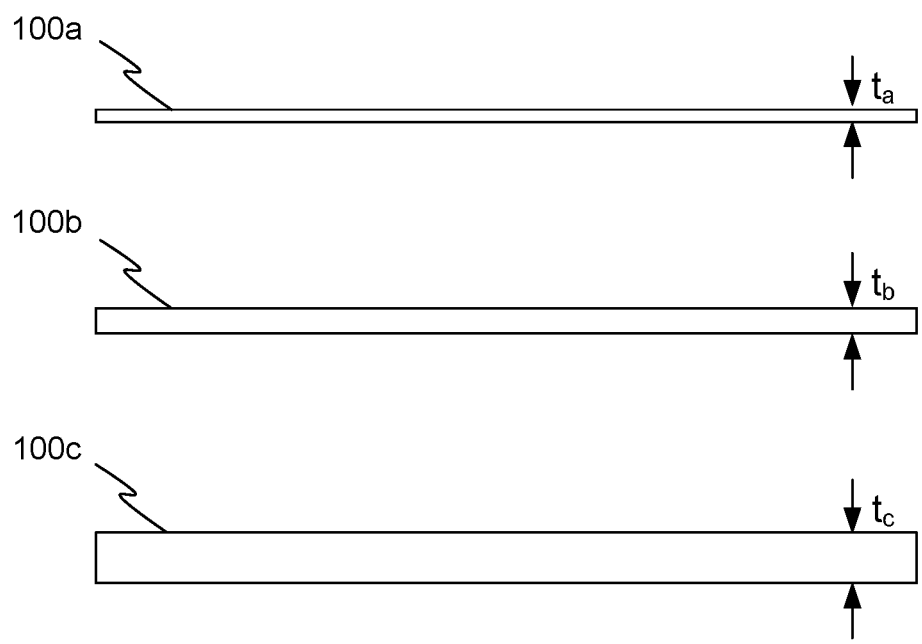
FIG. 1B is a simplified side-view illustration depicting differing widths of three difference substrates that can be processed within a tool in accordance with embodiments disclosed herein.

FIG. 1B is a simplified side-view illustration depicting differing substrates 100 each of which has the same general shape and diameter but different from each other in thickness. For example, as depicted, substrate 100a is thinner than substrate 100b which, in turn, is thinner than substrate 100c. While embodiments of the present invention are not limited to processing substrates of any particular thickness, as a non-limiting examples, in some embodiments substrate 100a can have a thickness $t_a$ of about 300 microns, substrate 100b can have a thickness $t_b$ of about 700 microns, and substrate 100c can have a thickness $t_c$ of about 1,400 microns. While each of the different substrates 100a, 100b and 100c can have the same overall shape and potentially be processed in the same tool for certain operations, the different thicknesses of the substrates can require that the tool have one or more components that need to be set or adjusted differently depending on whether a substrate 100a, 100b or 100c (or a series of substrates 100a, 100b or 100c) are transferred into the tool.

Embodiments of the disclosure provide methods and a system for automatically detecting the thickness of a substrate, such as substrates 100a, 100b and 100c, prior to transferring the substrate into a substrate processing tool. Some embodiments can then, if the substrate is either thicker or thinner than what tool is set up to process, generate an alert or signal indicating a mismatch in the actual thickness of the substrate about to be transferred into the tool and the expected thickness. In some embodiments, the tool can respond to the signal by, for example, preventing the transfer of the substrate into the tool or performing one or more adjustments within the tool to set the tool to accept and process substrates of the actual measured thickness. While embodiments of the disclosure can be used to detect the thickness of a variety of different types of substrates or samples, some embodiments are particularly useful in detecting the thickness of substrates that are semiconductor wafers or similar specimens.

Example Substrate Processing System

Figure 2:
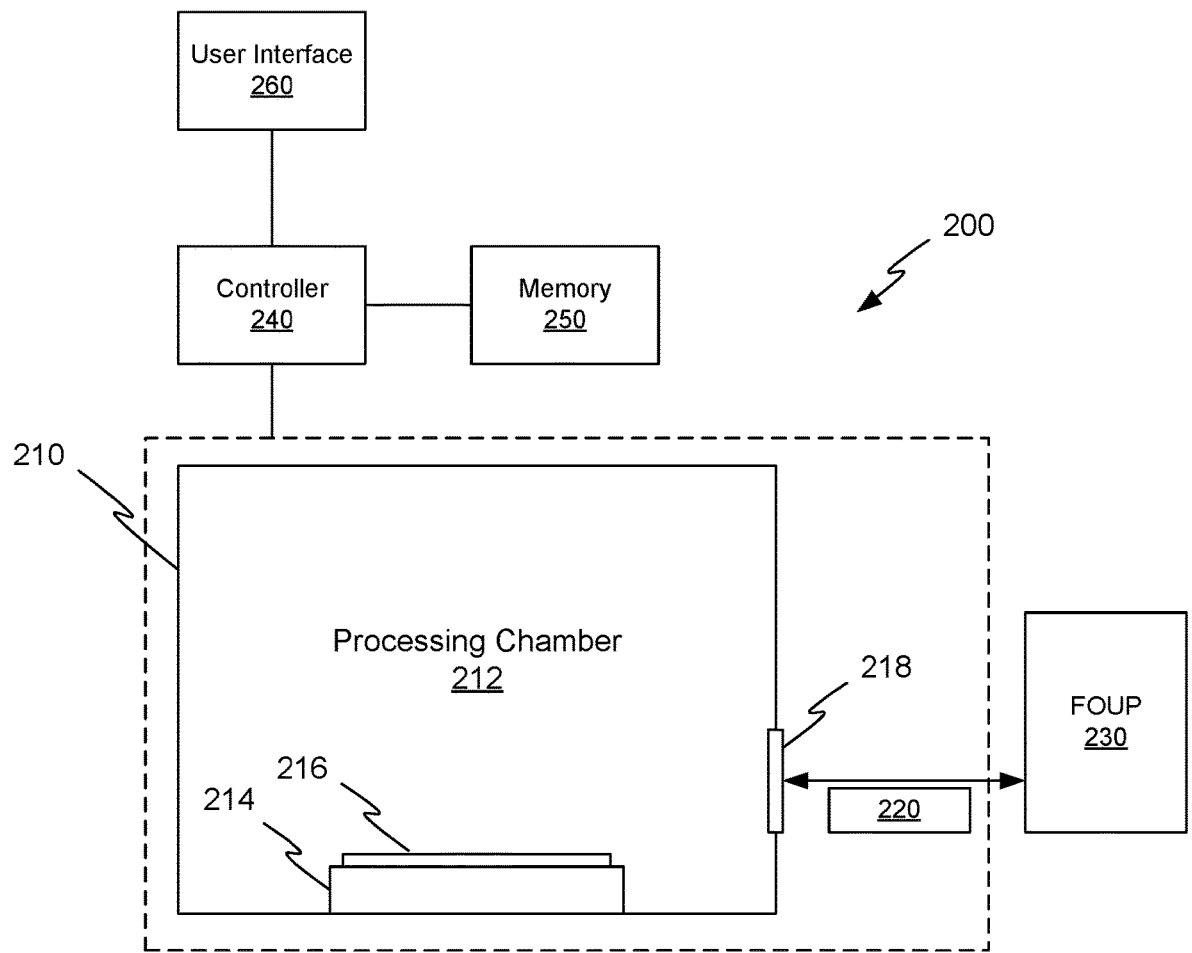
FIG. 2 is a simplified drawing of a substrate processing system in accordance with some embodiments.

In order to better understand and appreciate the disclosure, reference is now made to FIG. 2, which is a simplified schematic illustration of a substrate processing system 200 in accordance with embodiments disclosed herein. As shown, substrate processing system 200 can include a substrate processing tool 210 that can be used to process one or more substrates. Substrate processing tool can be any type of chamber including, but not limited to: a chemical vapor deposition unit, a physical vapor deposition unit, an etch unit, a chemical mechanical polishing unit, a photolithography unit, or a metrology unit, among others. In the depicted embodiment, substrate processing tool 210 includes a vacuum chamber 212, a substrate support 214 that is configured to hold a substrate 216 (e.g., one of substrates 100a, 100b or 100c) during a substrate processing operation, and a chamber door 218 that enables substrates, including substrate 216, to be transferred into and out of vacuum chamber 212.

Substrate processing system 200 also includes a substrate transfer mechanism 220 (e.g., a robot) and a substrate storage container 230. Substrate transfer mechanism 220 can transfer substrates between vacuum chamber 212 and substrate storage container 230 through chamber door 218. Substrate storage container can be an enclosure designed to hold substrates (e.g., wafers) securely and safely in a controlled environment and to allow the substrates to be transferred by substrate transfer mechanism 220 between different tools for processing or measurement. In some embodiments, substrate storage container 230 can be a Front Opening Unified Pod (FOUP), which is designed in accordance with a common protocol for delivering substrates between different tools in a fabrication facility.

As depicted in FIG. 2, substrate processing system 200 can also include one or more controllers, processors or other hardware units 240 that control the operation of system 200 (including both processing tool 210 and substrate transfer mechanism 220) by executing computer instructions stored in one or more computer-readable memories 250 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Additionally, a user-interface 260 can be provided to allow one or more users (e.g., workers in a semiconductor fabrication facility) to control various aspects of substrate processing system 200 including identifying the thickness of substrates to be transferred from substrate storage container 230 into substrate processing tool 210 so that various aspects of substrate processing tool 210 can be set accordingly. Various components and/or aspects of tool 210 that can be set or changed based on the thickness of the substrates to be processed within chamber 212 depend on the type of and design of tool 210. For example, in a deposition or etch tool, the position of substrate holder 214 (e.g., the z-direction height) and/or the default distance between a gas dispenser or manifold and the substrate holder might be set in accordance with substrate thickness. As another example, in a focused ion beam (FIB) tool, the position of substrate holder 214 (e.g., the z-direction height) and/or the default distance between the tip of the focused ion beam column might be set in accordance with substrate thickness.

In the past, once the thickness of the substrates within substrate storage container 230 is identified, system 200 can begin processing substrates within chamber 212. For example, system 200 can transfer a first substrate from storage container 230 into chamber 212 with transfer mechanism 220 and process the first substrate within chamber 212. When the processing operation is complete, transfer mechanism 220 can transfer the first substrate back into storage container 230 and transfer a new, second substrate into chamber 212 for processing. This sequence can then be repeated until all the substrates in storage container 230 have been processed in which case the storage container can be transferred to a different tool where the substrates in the container undergo a next processing operation.

Example Substrate Transfer Mechanism and Substrate Storage Container

Figure 3A:
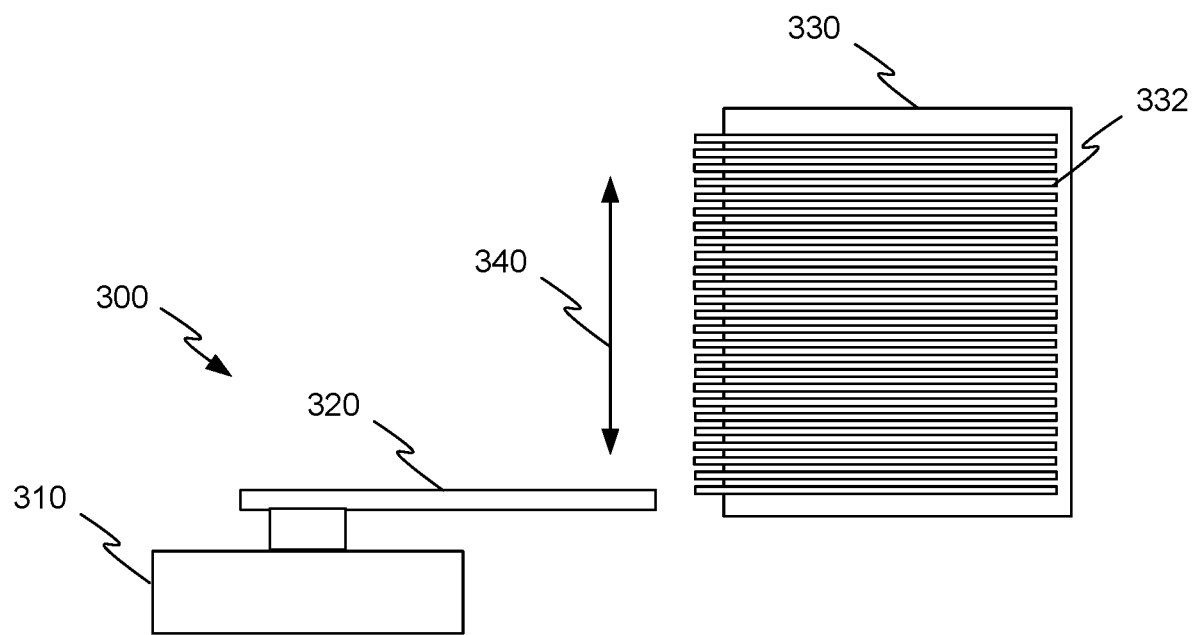
FIG. 3A is a simplified illustration of a substrate transfer mechanism and a substrate storage container according to some embodiments.

FIG. 3A is a simplified illustration of a substrate transfer mechanism 300 and a substrate storage container 330 according to some embodiments. Substrate transfer mechanism 300 can be representative of substrate transfer mechanism 220 discussed above with respect to FIG. 2 and substrate storage container 330 can be representative of substrate storage container 230. As shown, substrate transfer mechanism 300 includes a robot base 310 and an arm 320 that is attached to the base 310 while substrate storage container 330 can securely store a set of substrates 332 (e.g., twenty five substrates in some embodiments) in a controlled environment.

Figure 3B:
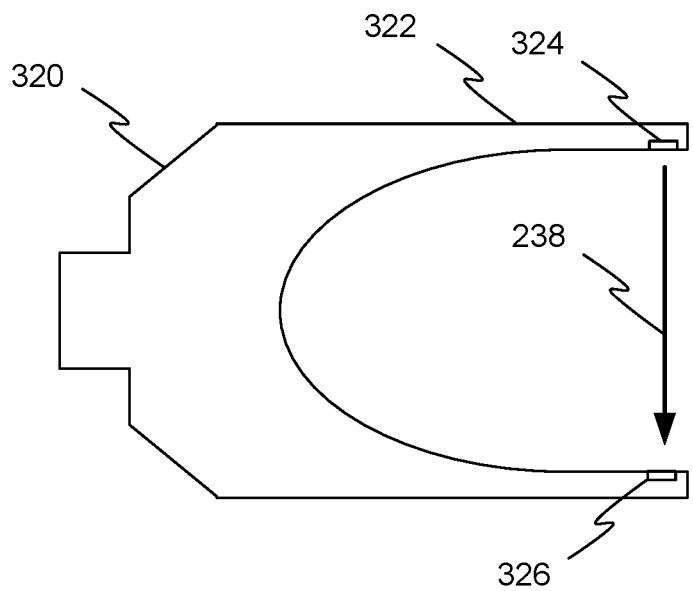
FIG. 3B is a simplified top view of a robot arm of the substrate transfer mechanism shown in FIG. 3A according to some embodiments.

As shown in FIG. 3B, which is a simplified top view of robot arm 320 according to some embodiments, arm 320 can include two opposing fingers 322. The robot arm 320 further includes an arm sensor that can be positioned at the distal end of the fingers 322. In some embodiments the arm sensor includes an emitter 324 and detector 326 pair. Emitter 324 can be a laser (e.g., as an edge emitting laser (EEL) or a vertical cavity surface emitting laser (VCSEL)) positioned at the tip of one of the fingers 322 and detector 326 can be a photodetector positioned at the tip of the opposite finger 322 such that detector 326 is spaced apart from aligned with emitter 324 in an oppositional relationship that allows the detector 326 to detect radiation 328 (e.g., a laser beam) emitted from emitter 324.

In operation, robot arm 320 can be extended towards and into substrate storage container 330 to pick up individual substrates from the storage container, transfer the picked up substrate into a substrate processing tool (e.g., into substrate processing chamber 212). Then, after processing is complete, arm 320 can pick the substrate back up from within chamber 212 and transfer it back to storage container 330.

Figure 4:
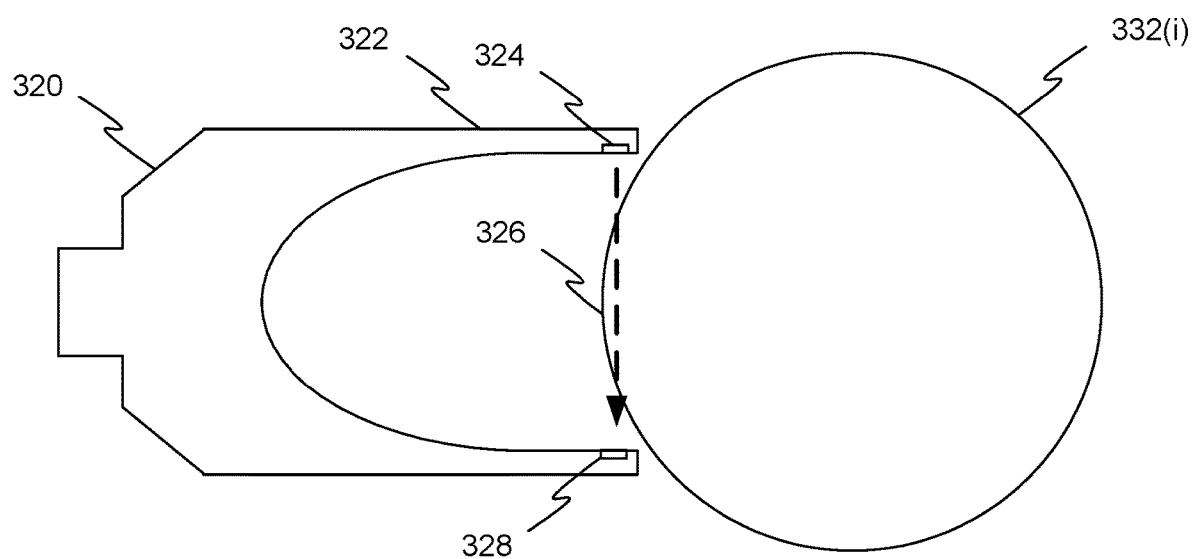
FIG. 4 is a simplified top view depicting the positional relationship between the robot arm shown in FIGS. 3A and 3B and a periphery of a sample having its thickness measured according to some embodiments.

In addition to being extended outward into substrate storage container 330, arm 320 can be moved up and down in the z-direction (represented by arrow 340) to select any of the stacked substrates within container 330. In normal operation, substrate transfer mechanism 300 can use signals generated from detector 326 to properly position itself vertically with respect to an individual substrate 332(i) within substrate stack 332 that is to be transferred. For example, arm 320 can extend outward towards one of the substrates in stack 332 such that a periphery of the substrate is positioned within the gap between the two oppositional fingers 324 as shown in FIG. 4 but beneath (or above) the substrate 332(i). Then, arm 320 can be raised (or lowered) with respect to substrate 332(i) until the substrate 332(i)

interrupts radiation beam 328, which indicates the vertical location of the substrate 332(i) to substrate transfer mechanism 300.

Detecting Substrate Thickness

Figure 5:
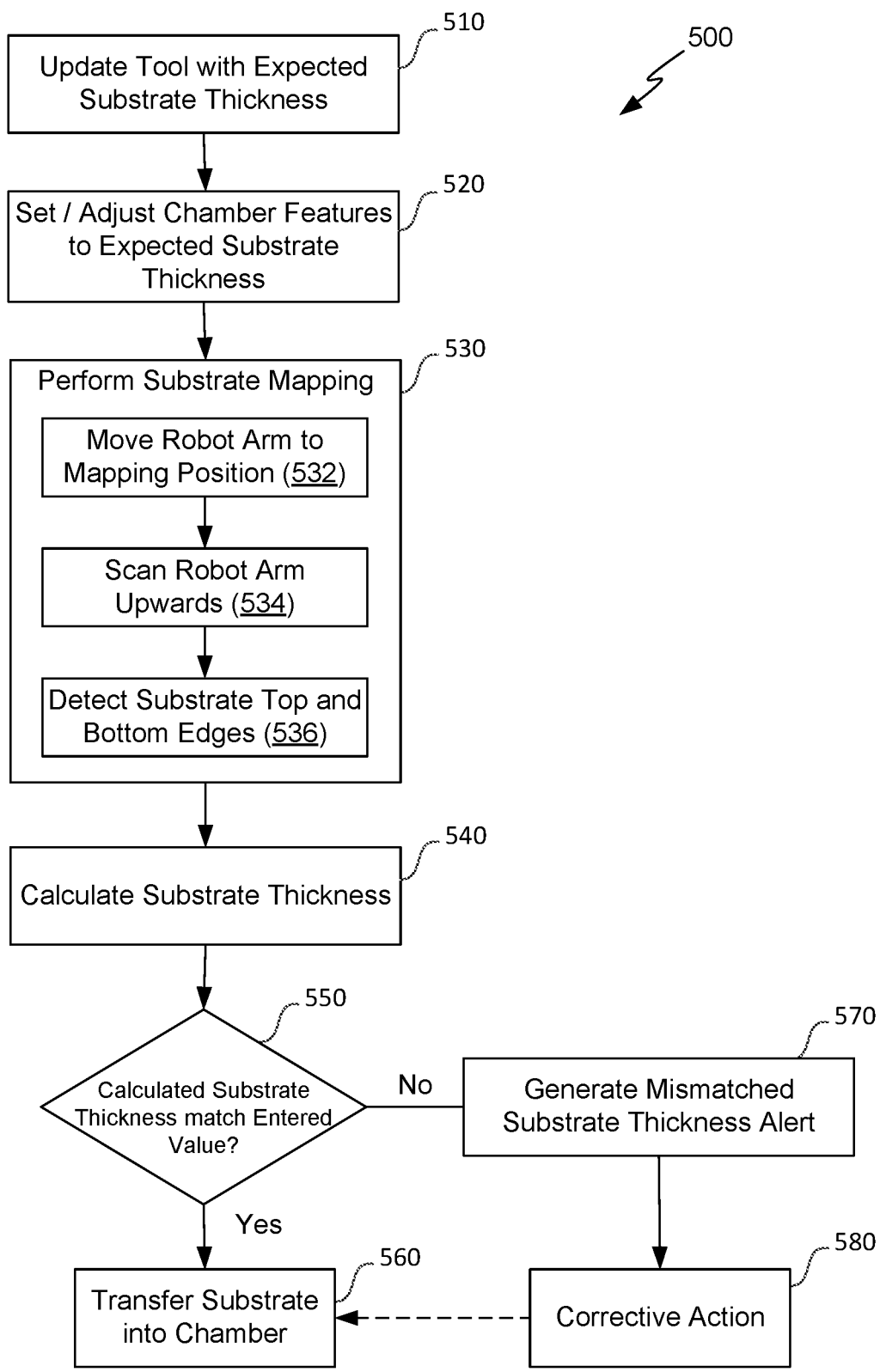
FIG. 5 is a flowchart depicting steps associated with a method according to some embodiments.

Embodiments disclosed herein, can use the emitter/detector feature of substrate transfer mechanism 300 to measure a thickness of individual substrates and ensure that substrates that are transferred into a processing chamber serviced by substrate transfer mechanism 300 are of the thickness that the processing chamber is set to accept and process. To illustrate, reference is made to FIGS. 5 and 6A-6D. FIG. 5 is a flowchart depicting steps associated with a method 500 according to some embodiments disclosed herein and FIGS. 6A-6D are simplified schematic diagrams depicting positional relationships between a substrate transfer mechanism and substrate during different steps of method 500. Each of FIGS. 6A-6D depict, side-by-side in each figure, both a front view and a top view of a substrate 610 that is to be loaded into a processing chamber. For ease of illustration, FIGS. 6A-6D only depict the substrate 610 and portions of a substrate transfer mechanism including a laser 622, a photodetector 624 and a laser beam 626 that is emitted from laser 622 can be detected by photodetector 624 when the beam is not interrupted by, for example, a portion of substrate 610. Laser 622 and photodetector 624 can be representative of emitter 324 and photodetector 326, respectively.

Method 500 can start by moving a substrate storage container (e.g., container 230) into position such that substrates within the container (including substrate 610) can be loaded into a substrate processing system (e.g., system 200) and updating the substrate processing system with information that that indicates, among other things, the thickness of substrates stored in the substrate storage container (block 510). The substrate thickness information can be entered in any appropriate manner. For example, in some embodiments, the information can be entered by a user (e.g., a worker in a semiconductor fabrication system) via user interface 260. Next, one or more components of the processing tool (e.g., substrate processing tool 210) can be set or adjusted to setup the tool to process substrates having the expected thickness (block 520) as discussed above. For example, in a deposition or etch tool, the position of substrate holder 214 (e.g., the z-direction height) and/or the default distance between a gas dispenser or manifold and the substrate holder can be set in accordance with substrate thickness. As another example, in focused ion beam (FIB) tool or scanning electron microscope (SEM) tool, the position of substrate holder 214 (e.g., the z-direction height) and/or the default distance between the tip of the focused ion beam column or scanning electron microscope column can be set in accordance with substrate thickness.

Next, substrate transfer mechanism 300 can initiate a mapping process (block 530) in which the quantity of substrates and position (e.g., slot number in a FOUP) of each substrate is mapped and recorded (e.g., in memory 250) by the system prior to transferring any substrates into the substrate processing chamber. The mapping process can begin by extending robot arm 320 towards and slightly into the substrate storage container such that the arm is below the bottom most substrate while a periphery of each substrate in the substrate stack is positioned directly above the gap between the two oppositional fingers 324 (block 532) as discussed above with respect to FIG. 4. As a non-limiting example, in some embodiments the mapping process can be done with the robot arm being positioned such that laser beam 626 is 6 mm past the edge of the substrates. During the mapping process, laser 622 can project laser beam 626 towards photodetector 624 and the robot arm is scanned upwards so that the laser beam passes across an outer periphery of each of the individual substrates in the substrate storage container (block 534).

Figure 6A:
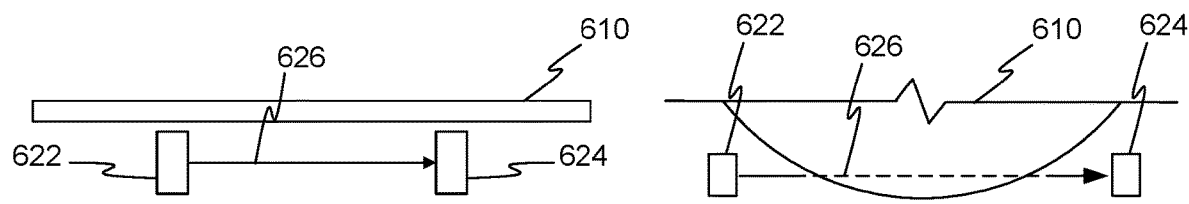
FIGS. 6A-6D are simplified schematic diagrams depicting positional relationships between a substrate transfer mechanism and substrate during different steps of the method depicted in FIG. 5 according to some embodiments.
Figure 6B:
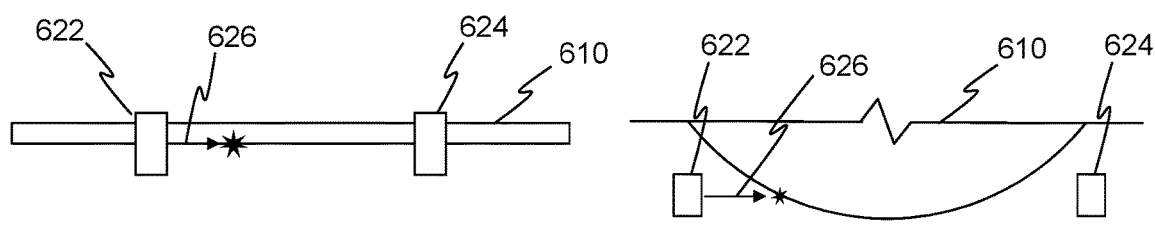
Figure 6C:
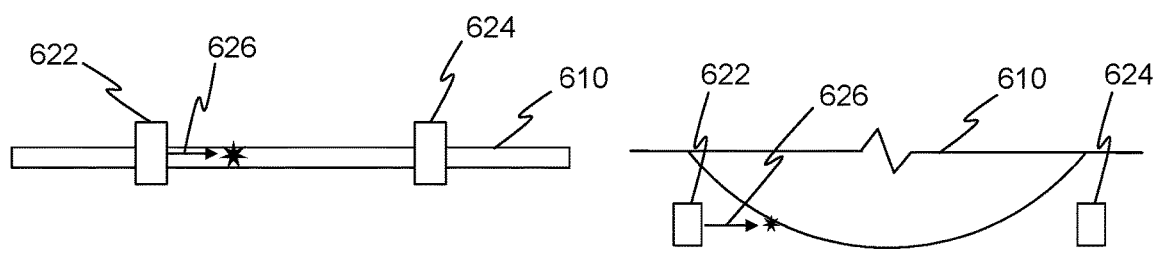
Figure 6D:
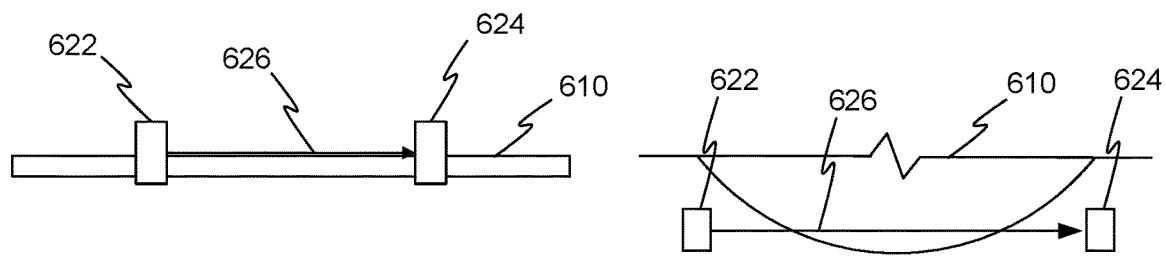

As the robot arm is scanned upwards at a constant velocity (block 534), the laser beam will be intermittently interrupted by each individual substrate in the container. To illustrate the process for one individual substrate 610, reference is made to FIGS. 6A-6D. As shown in FIG. 6A, when laser beam 626 is below substrate 610 the beam is not interrupted by the substrate and is thus detected by photodetector 624 (note that the right portion of FIG. 6A shows the portion of laser beam 626 that passes underneath substrate 610 in this position via a dashed line). As the robot arm is scanned upwards, laser beam 626 will contact the lower edge of substrate 610 (shown by the star in FIG. 6B). The interruption of laser beam 626 prevents photodetector 624 from detecting the laser beam and can be noted (and saved in a computer memory) as the lower edge of substrate 610. The interruption of laser beam 626 continues as the robot arm is raised further (FIG. 6C) until the robot arm passes the upper edge of substrate 610. At that time (represented in FIG. 6D), laser beam 626 is no longer interrupted by substrate 610 and can again be detected by photosensor 624. The renewed detection of laser beam 626 can then be noted (and saved in a computer memory) as the upper edge of substrate 610 (block 536). In some embodiments, the edge detection process can be repeated for each and every substrate in the substrate storage container.

With both the lower and upper edges of substrate 610 having been detected, the thickness of substrate 610 can be easily calculated (block 540). For example, where the substrate transfer mechanism records the absolute or relative z height position of robot arm, the thickness of substrate 610 can be determined by the difference between the z height position recorded at the lower substrate edge and the upper substrate edge. As another example, if the detection of the lower and upper edges of substrate 610 are stored in memory as units of time, the thickness of substrate 610 can be calculated based on the time difference between the two detection events multiplied by the velocity of the robot arm in the z direction.

Next, the substrate processing system can compare the calculated substrate thickness from block 540 with the entered/expected substrate thickness from block 510 (block 550). If the two match, substrate 610 can be transferred into the substrate processing chamber to undergo whatever substrate processing operation the chamber is equipped to carry out (block 560). To transfer the substrate, in some embodiments, the robot arm can drop immediately below the substrate, extend further into the substrate container and then move upwards slightly so that the substrate rests on an upper surface of the robot arm including the upper surface of fingers 322.

A match can be determined based on any appropriate criteria. For example, in some embodiments a match can be determined based on whether the calculated thickness is within a predetermined percent of the expected thickness (e.g., within 5%, within 10%, or within 20%). As another example, in some embodiments, thickness can be calculated in accordance with blocks 550 and 560 on sample substrates of different thicknesses and the calculated measurements, which might differ from actual thickness of the substrates, can then be coordinated with actual substrate thicknesses and stored in a lookup table or similar data structure. Then, when thickness measurements of a substrate to be processed in accordance with method 500 are calculated, the calculated thickness can be compared to the lookup table and correlated to expected thickness to determine a match. The lookup table can be referenced based on ranges stored in the table or an average or median can be stored in the table and the correlation can be made based on the calculated thickness falling within a predetermined percentage of the stored average or median value.

If the calculated substrate thickness does not match the entered/expected substrate thickness, however, a "mismatched substrate thickness" alert can be generated (block 570) and appropriate corrective action can be taken (block 580). Corrective action can include any appropriate action to remedy the substrate thickness mismatch. As non-limiting examples, such action can include one or more of the following: sending an alert to an operator of the tool (e.g., a worker within the fabrication facility) so that the operator can take corrective action; automatically changing or otherwise altering settings of the tool to adjust one or more chamber components so that the chamber is set up to handle substrates having the calculated thickness instead of the initially expected thickness; preventing the transfer of substrate 610 into the processing chamber and replacing its substrate storage container with a new substrate storage container that includes substrates having the expected thickness.

In some embodiments, once the appropriate corrective action is taken, substrates are ready to be transferred into the processing chamber as shown by the dashed line from block 580 to block 560. As described above, method 500 can be implemented as part of an initial mapping process in which the quantity of substrates and position (e.g., slot number in a FOUP) of each substrate is mapped and recorded (e.g., in memory 250) by the system prior to transferring any substrates into the substrate processing chamber. Such a mapping process can be performed whenever a new substrate storage container is delivered to the system. In other embodiments, method 500 can be implemented individually for each substrate in a given substrate storage container separate from or instead of the described mapping process.

Figure 7:
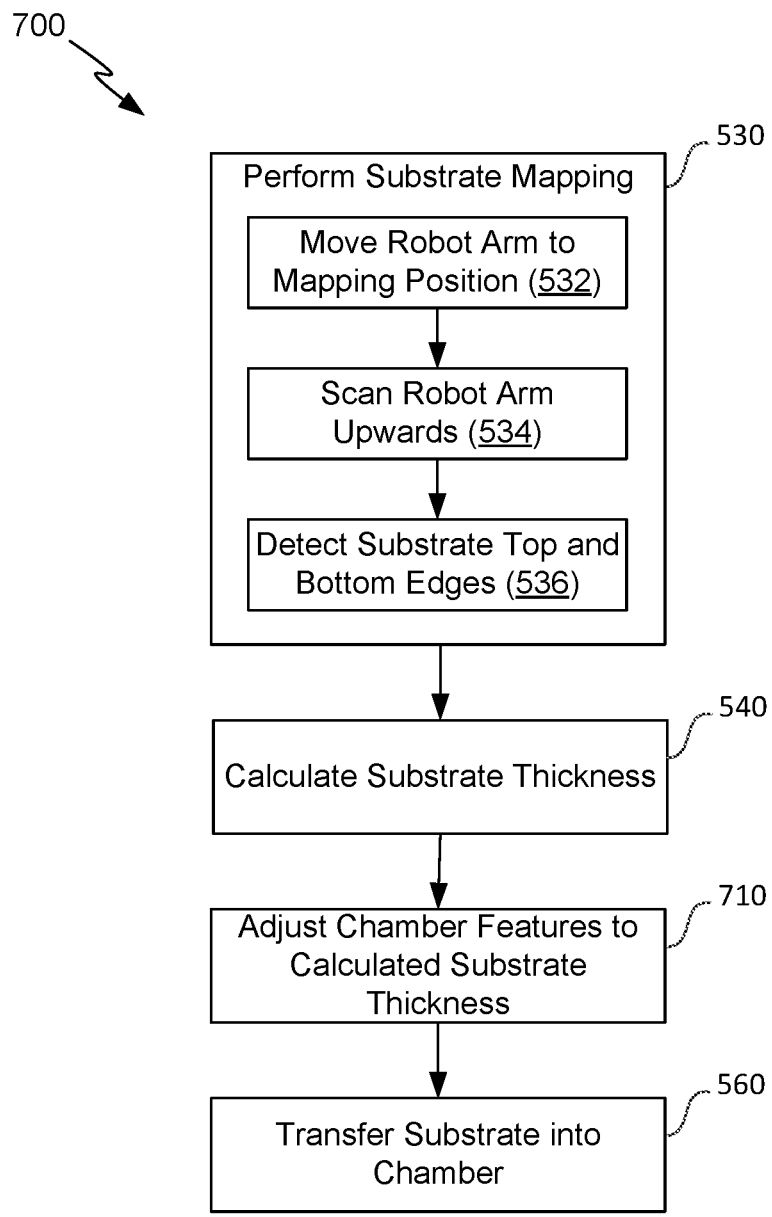
FIG. 7 is a flowchart depicting steps associated with a method according to some embodiments.

While method 500 included initial steps of having a user enter information about expected substrate thickness into a substrate processing system, in some embodiments such preliminary step is unnecessary. For example, FIG. 7 is a flowchart depicting steps associated with a method 700 according to some embodiments. Method 700 includes many of the same steps as method 500 and, for the sake of brevity, a description of such steps is not repeated. Method 700 differs from method 500, however, in that method 700 can be completely automated with the substrate processing system such that, once the substrate thickness is calculated (block 540), the substrate processing chamber is adjusted automatically to process substrates of the calculated thickness (block 710).

Example Sample Evaluation System

Figure 8:
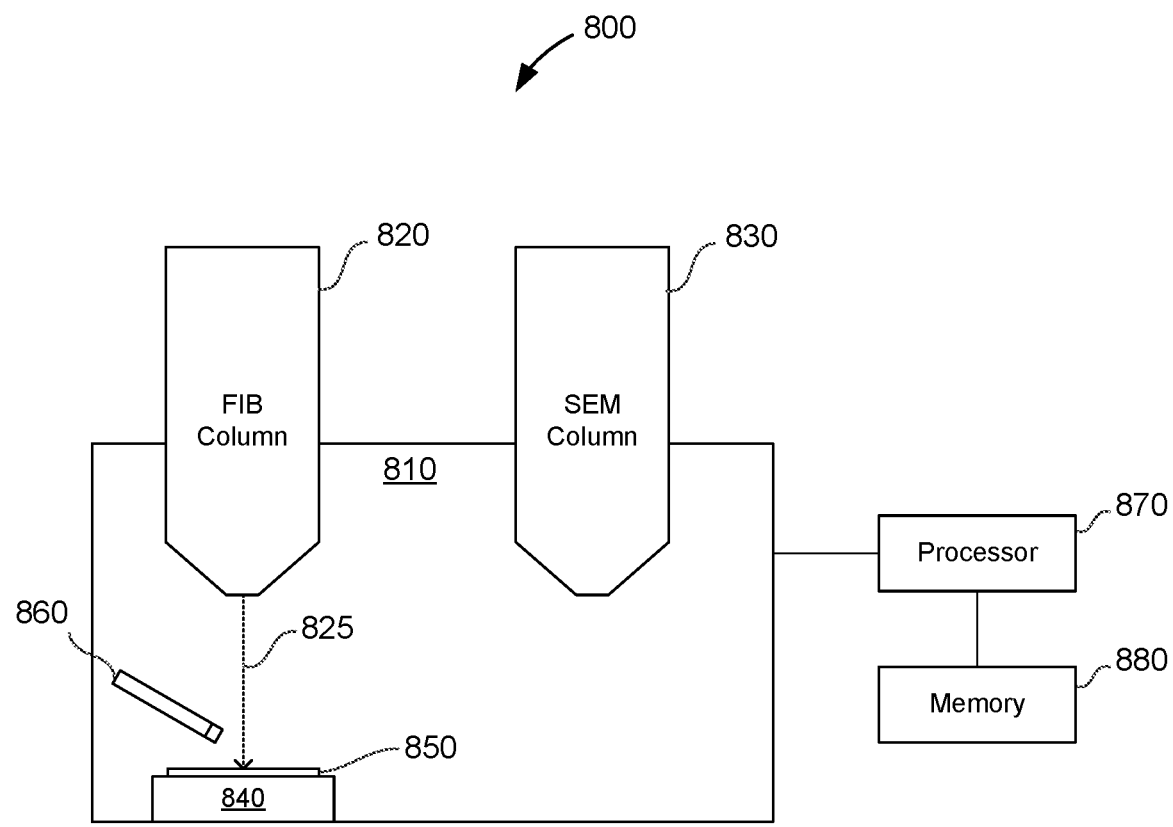
FIG. 8 is simplified illustration of a sample evaluation system according to some embodiments of the disclosure.

While embodiments disclosed herein can be beneficially used with many different types of substrate processing chambers, one particular type of processing chamber that embodiments can be employed with is substrate evaluation system that can be used for, among other operations, milling and imaging semiconductor wafers as well as depositing various materials over substrates using particle enhanced deposition process. FIG. 8 is a simplified schematic illustration of such a substrate evaluation system 800. Substrate processing system 800 can include a vacuum chamber 810 along with a focused ion beam (FIB) column 820 and a scanning electron microscope (SEM) column 830. A supporting element 840 can support a sample 850 (e.g., a semiconductor wafer) within chamber 810 during a processing operation in which the sample 850 (sometimes referred to herein as an "object" or a "specimen") is subject to a charged particle beam from one of the FIB or SEM columns 820, 830 and can move the sample within vacuum chamber 810 between the field of view of the two columns 820 and 830 as required for processing.

During a processing operation, one or more gases can be delivered into chamber 810 by a gas injection system 860 for certain operations. For simplicity of explanation gas injection system 860 is illustrated in FIG. 8 as a nozzle, but it is noted that gas injection system 860 can include gas reservoirs, gas sources, valves, one or more inlets and one or more outlets, among other elements. In some embodiments gas injection system 860 can be configured to deliver gas to a localized area of sample 850 that is exposed to the scan pattern of the charged particle beam as opposed to delivering gas to an entire upper surface of the sample. For example, in some embodiments gas injection system 860 has a nozzle diameter measured in hundreds of microns (e.g., between 400-500 microns) that is configured to deliver gas directly to a relatively small portion of the sample's surface that encompasses the charged particle beam scan pattern. In various embodiments, a first gas injection system 860 can be configured to deliver gas to a sample disposed under FIB column 820 and a second gas injection system 860 can be configured to deliver gas to a sample disposed under SEM column 830.

FIB column 820 and SEM column 830 are connected to vacuum chamber 810 so that a charged particle beam generated by either one of the charged particle columns propagates through a vacuumed environment formed within vacuum chamber 810 before impinging on sample 850. For example, as shown in FIG. 8, FIB column 820 can generate a focused ion beam 825 that travels through the vacuum environment of chamber 810 before colliding with sample 850.

FIB column 820 can mill (e.g., drill a hole in) sample 850 by irradiating the sample with one or more charged particle beams to form a cross section and can also smooth the cross section. The cross section can include one or more first portions of a first material and one or more second portions of a second material. The cross section can also include additional portions of other materials. Conveniently, the smoothing operation involves utilizing smaller acceleration voltages in relation to the milling of the sample. SEM column 830 can generate an image of a portion of sample 850 by illuminating the sample with a charged particle beam, detecting (e.g., with an appropriate detector not shown in FIG. 8) particles emitted due to the illumination and generating charged particle images based on the detected particles.

The particle imaging and milling processes each typically include scanning a charged particle beam back-and-forth (e.g., in a raster scan pattern) at a constant rate across a particular area of the sample being imaged or milled. One or more lenses (not shown) coupled to the charged particle column can implement the scan pattern as is known to those of skill in the art. The area scanned is typically a very small fraction of the overall area of sample. For example, the sample can be a semiconductor wafer with a diameter of either 200 or 300 mm while each area scanned on the wafer can be a rectangular area having a width and/or length measured in microns or tens of microns.

As shown in FIG. 8, system 800 can include one or more controllers, processors or other hardware units 870 that control the operation of system 800 by executing computer instructions stored in one or more computer-readable memories 880 as would be known to persons of ordinary skill in the art. By way of example, the computer-readable memories can include a solid-state memory (such as a random access memory (RAM) and/or a read-only memory (ROM), which can be programmable, flash-updateable and/or the like), a disk drive, an optical storage device or similar non-transitory computer-readable storage mediums.

Example of a Sample to be Transferred

Figure 9:
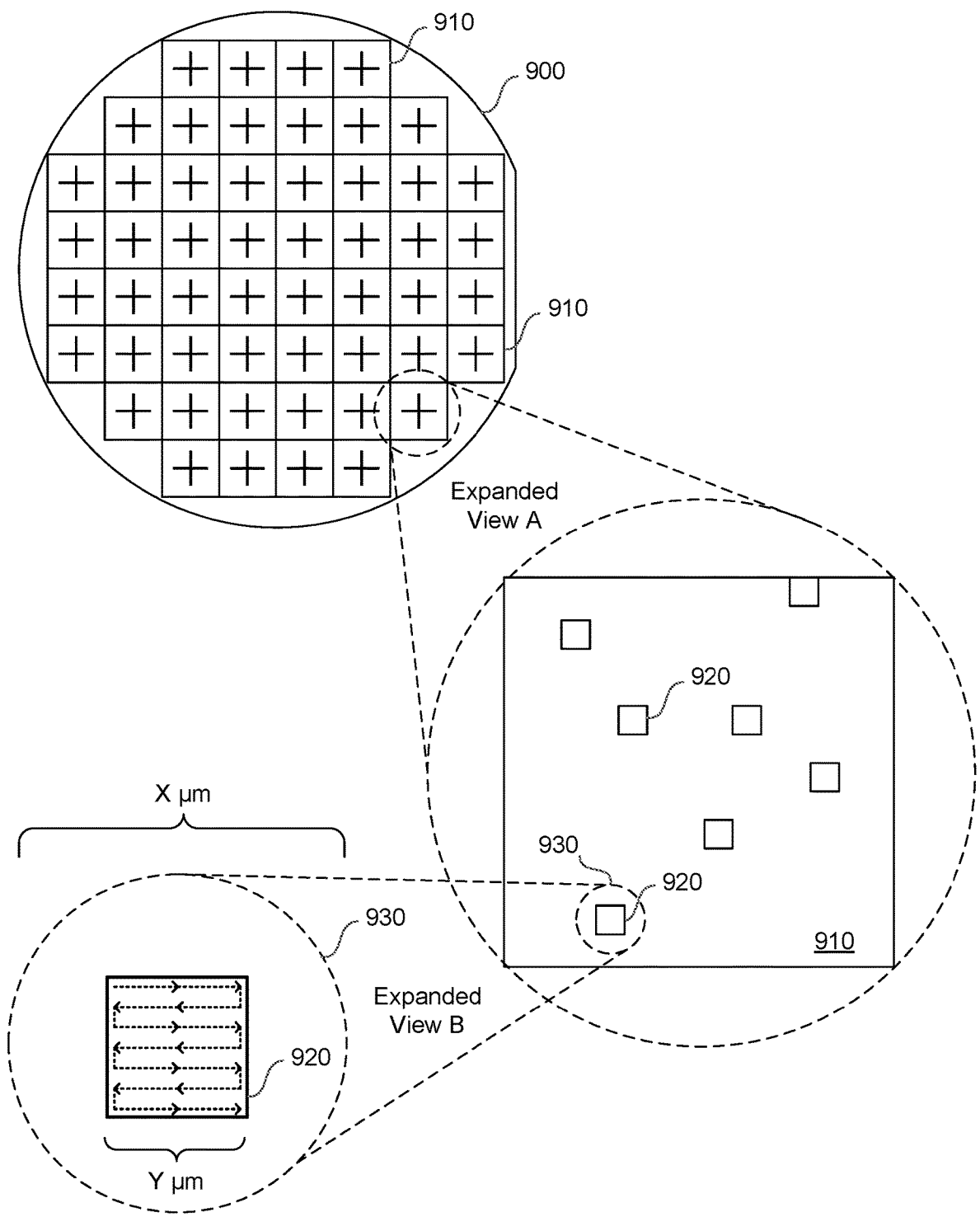
FIG. 9 is a simplified illustration of an area on a semiconductor wafer that can be transferred into a substrate processing chamber according to some embodiments.

As stated above, while embodiments of the disclosure can be used in conjunction with processing many types of samples or substrates, some embodiments are particularly useful at measuring the thickness of wafers used in the manufacture of semiconductor devices including silicon wafers, gallium arsenide wafers and others. As one non-limiting example, FIG. 9 is a simplified illustration of an area on a semiconductor wafer that can be transferred into a substrate processing chamber, such as chamber 800 discussed above, according to some embodiments. Specifically, FIG. 9 includes a top view of wafer 900 along with two expanded views of specific portions of wafer 900. Wafer 900 can be, for example, a 150 mm, 200 mm or 300 mm semiconductor wafer and can include multiple integrated circuits 910 (fifty two in the example depicted) formed thereon. The integrated circuits 910 can be at an intermediate stage of fabrication and the chamber 800 can be used to evaluate and analyze one or more regions 920 of the integrated circuits once substrate 900 is transferred into the chamber in accordance with one of methods 500 or 700 discussed above.

ADDITIONAL EMBODIMENTS

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not target to be exhaustive or to limit the embodiments to the precise forms disclosed. For example, while method 500 and 700 were discussed above as detecting the edges of a substrate as the robot arm moves from a position below the substrate to above the substrate, in some embodiments the detection process can be reversed with the robot arm moving from above the substrate to below the substrate. Also, in other embodiments the top and bottom edges of the substrate can be detected using other techniques, such as with a camera or other imaging device positioned a known distance from the substrate.

Also, while different embodiments of the disclosure were disclosed above, the specific details of particular embodiments may be combined in any suitable manner without departing from the spirit and scope of embodiments of the disclosure. Further, it will be apparent to one of ordinary skill in the art that many modifications and variations are possible in view of the above teachings. It is, therefore, to be understood that the appended claims are intended to cover all such modifications and changes as fall within the true spirit of the embodiments of the disclosure.

Additionally, any reference in the specification above to a method should be applied mutatis mutandis to a system capable of executing the method and should be applied mutatis mutandis to a computer program product that stores instructions that once executed result in the execution of the method. Similarly, any reference in the specification above to a system should be applied mutatis mutandis to a method that may be executed by the system should be applied mutatis mutandis to a computer program product that stores instructions that can be executed by the system; and any reference in the specification to a computer program product should be applied mutatis mutandis to a method that may be executed when executing instructions stored in the computer program product and should be applied mutandis to a system that is configured to executing instructions stored in the computer program product.

Also, where the illustrated embodiments of the present disclosure can, for the most part, be implemented using electronic components and circuits known to those skilled in the art, details of such are not be explained in any greater extent than that considered necessary as illustrated above, for the understanding and appreciation of the underlying concepts of the present disclosure and in order not to obfuscate or distract from the teachings of the present disclosure.

What is claimed is:

1. A method of operating a substrate processing system that includes a substrate processing chamber, a substrate storage container and robot configured to select a substrate from the substrate storage container and transfer a selected substrate into the substrate processing chamber, the method comprising:
    detecting a lower edge and upper edge of the substrate;
    calculating a thickness of the substrate based on the detected lower and upper edges of the substrate;
    comparing the calculated thickness of the substrate to an expected thickness of the substrate; and
    (i) if the calculated thickness matches the expected thickness, controlling the robot to transfer the substrate into the substrate processing chamber;
    (ii) if the calculated thickness does not match the expected thickness, automatically setting or adjusting one or more components of the substrate processing chamber to process substrates of the calculated substrate thickness.

2. The method of operating a substrate processing system set forth in claim 1 wherein detecting the lower and upper edges of the substrate is done during a substrate mapping process in which in which a quantity of substrates in and position of each substrate in the substrate storage container is mapped and recorded.

3. The method of operating a substrate processing system set forth in claim 2 wherein the substrate storage container is a Front Opening Unified Pod (FOUP).

4. The method of operating a substrate processing system set forth in claim 1 wherein the robot includes a robot arm having a sensor configured to detect the lower and upper edges of the substrate.

5. The method of operating a substrate processing system set forth in claim 4 wherein the robot arm comprises first and second fingers spaced apart from each other in an oppositional relationship and the sensor comprises a laser and a photodetector, the laser being positioned near a distal end of the first finger and the photodetector being positioned near a distal end of the second finger and aligned with the laser such that the photodetector can detect a laser beam emitted from the laser.

6. The method of operating a substrate processing system set forth in claim 5 wherein detecting the lower and upper edges of the substrate is done as the robot arm is scanned vertically across the substrate storage container and positioned such that an outer periphery of the substrate passes between the first and second fingers interrupting the laser beam during the scanning process.

7. The method of operating a substrate processing system set forth in claim 5 wherein automatically setting or adjusting one or more components of the substrate processing chamber to process substrates of the calculated substrate thickness comprises setting a height distance between a substrate holder and a tip of a charged particle column.

8. The method of operating a substrate processing system set forth in claim 5 wherein automatically setting or adjusting one or more components of the substrate processing chamber to process substrates of the calculated substrate thickness comprises setting a height distance between a substrate holder and a gas dispenser or manifold.

9. The method of operating a substrate processing system set forth in claim 1 wherein the system further comprises a controller operatively coupled to control functions of the substrate processing system and a computer-readable memory coupled to the controller, and wherein the method further comprises entering the expected substrate thickness into the computer-readable memory via a user interface prior to detecting the lower and upper edges of the substrate.

10. The method of operating a substrate processing system set forth in claim 1 further comprising, prior to detecting the lower and upper edges of the substrate, setting or adjusting one or more components of the substrate processing chamber based on the expected thickness of the substrate.

11. The method of operating a substrate processing system set forth in claim 1 wherein the substrate processing chamber can be used for defect review, classification and analysis and the chamber includes a focused ion beam (FIB) column and a scanning electron microscope (SEM) column.

12. The method of operating a substrate processing system set forth in claim 1 wherein the substrate is a semiconductor wafer.

13. A substrate processing system comprising:
a substrate processing chamber;
a substrate storage container;
a robot configured to select a substrate from the substrate storage container and transfer the selected substrate into the substrate processing chamber; and
a processor and a memory coupled to the processor, the memory including a plurality of computer-readable instructions that, when executed by the processor, cause the system to:
detect a lower edge and upper edge of the substrate;
calculate a thickness of the substrate based on the detected lower and upper edges of the substrate;
compare the calculated thickness of the substrate to an expected thickness of the substrate, and: (i) if the calculated thickness matches the expected thickness, controlling the robot to transfer the substrate into the substrate processing chamber, (ii) if the calculated thickness does not match the expected thickness, automatically setting or adjusting one or more components of the substrate processing chamber to process substrates of the calculated substrate thickness.

14. The substrate processing system set forth in claim 13 wherein the lower and upper edges of the substrate are detected during a substrate mapping process in which in which a quantity of substrates in and position of each substrate in the substrate storage container is mapped and recorded.

15. The substrate processing system set forth in claim 13 wherein the robot includes a robot arm having first and second fingers spaced apart from each other in an oppositional relationship and a sensor comprising a laser positioned near a distal end of the first finger and a photodetector positioned near a distal end of the second finger and aligned with the laser such that the photodetector can detect a laser beam emitted from the laser.

16. The substrate processing system set forth in claim 15 wherein the lower and upper edges of the substrate are detected as the robot arm is scanned vertically across the substrate storage container and positioned such that an outer periphery of the substrate passes between the first and second fingers interrupting the laser beam during the scanning process.

17. A non-transitory computer-readable memory that stores computer-readable instructions for operating a substrate processing system that includes a substrate processing chamber, a substrate storage container and robot configured to select a substrate from the substrate storage container and transfer the selected substrate into the substrate processing chamber, wherein, when executed by a processor operatively coupled to the substrate processing system, the computer-readable instructions cause the processor to control the substrate processing system to:
detect a lower edge and upper edge of the substrate;
calculate a thickness of the substrate based on the detected lower and upper edges of the substrate;
compare the calculated thickness of the substrate to an expected thickness of the substrate, and (i) if the calculated thickness matches the expected thickness, controlling the robot to transfer the substrate into the substrate processing chamber, (ii) if the calculated thickness does not match the expected thickness, automatically setting or adjusting one or more components of the substrate processing chamber to process substrates of the calculated substrate thickness.

18. The non-transitory computer-readable memory set forth in claim 17 wherein the lower and upper edges of the substrate are detected during a substrate mapping process in which in which a quantity of substrates in and position of each substrate in the substrate storage container is mapped and recorded.

19. The non-transitory computer-readable memory set forth in claim 17 wherein the robot includes a robot arm having first and second fingers spaced apart from each other in an oppositional relationship and a sensor comprising a laser positioned near a distal end of the first finger and a photodetector positioned near a distal end of the second finger and aligned with the laser such that the photodetector can detect a laser beam emitted from the laser.

20. The non-transitory computer-readable memory set forth in claim 19 wherein the lower and upper edges of the substrate are detected as the robot arm is scanned vertically across the substrate storage container and positioned such that an outer periphery of the substrate passes between the first and second fingers interrupting the laser beam during the scanning process.

* * * * *